US012488963B2

(12) United States Patent
Kim et al.

(10) Patent No.: US 12,488,963 B2
(45) Date of Patent: Dec. 2, 2025

(54) SUBSTRATE PROCESSING APPARATUS

(71) Applicant: EUGENE TECHNOLOGY CO., LTD., Yongin-si (KR)

(72) Inventors: Yong Ki Kim, Hwaseong-si (KR); Yang Sik Shin, Yongin-si (KR); Dong Been Huh, Bucheon-si (KR); Tae Ho Lee, Yeoju-si (KR)

(73) Assignee: EUGENE TECHNOLOGY CO., LTD., Yongin-si (KR)

( * ) Notice: Subject to any disclaimer, the term of this patent is extended or adjusted under 35 U.S.C. 154(b) by 334 days.

(21) Appl. No.: 17/778,757

(22) PCT Filed: Nov. 19, 2020

(86) PCT No.: PCT/KR2020/016397
§ 371 (c)(1),
(2) Date: May 20, 2022

(87) PCT Pub. No.: WO2021/101279
PCT Pub. Date: May 27, 2021

(65) Prior Publication Data

US 2023/0005712 A1 Jan. 5, 2023

(30) Foreign Application Priority Data

Nov. 21, 2019 (KR) ........................ 10-2019-0150361

(51) Int. Cl.
*H01J 37/32* (2006.01)

(52) U.S. Cl.
CPC ..... *H01J 37/3211* (2013.01); *H01J 37/32715* (2013.01)

(58) Field of Classification Search
CPC ............. H01J 37/3211; H01J 37/32715; H01J 2237/332–3348
USPC ........................................................ 118/723 I
See application file for complete search history.

(56) References Cited

U.S. PATENT DOCUMENTS 5,888,413 A * 3/1999 Okumura .............. C23C 16/507
216/68
6,229,264 B1 * 5/2001 Ni ..................... H01J 37/32266
118/723 AN
2012/0097647 A1 * 4/2012 Fischer .................... H05H 1/46
219/121.48
2012/0305527 A1 * 12/2012 Kim ....................... H01Q 21/06
343/757
2016/0079042 A1 * 3/2016 Likhanskii ............. H01J 37/08
315/34
2019/0013186 A1 * 1/2019 Mishra ................ H01J 37/3211
(Continued)

FOREIGN PATENT DOCUMENTS

JP H09-55375 A 2/1997
JP 2001353440 A * 12/2001
(Continued)

*Primary Examiner* — Charlee J. C. Bennett
(74) *Attorney, Agent, or Firm* — Rabin & Berdo, P.C.

(57) ABSTRACT

In accordance with an exemplary embodiment of the present invention, an apparatus for processing substrate comprising: a support plate; an antenna disposed in parallel to one surface of the support plate and having 1st to n-th turns (n=an integer greater than 3) wound along one direction from an inner end; and a distance control unit capable of adjusting separation distances formed between the 1st to n-th turns.

6 Claims, 4 Drawing Sheets

(56) References Cited

U.S. PATENT DOCUMENTS

| | | | | |
|---|---|---|---|---|
| 2021/0183619 | A1 * | 6/2021 | Patrick | H01Q 1/36 |
| 2021/0335583 | A1 * | 10/2021 | Choi | H01J 37/32568 |

FOREIGN PATENT DOCUMENTS

| | | | | |
|---|---|---|---|---|
| JP | 2007214262 | A | * | 8/2007 |
| KR | 10-2002-0013842 | A | | 2/2002 |
| KR | 10-2005-0096391 | A | | 10/2005 |
| KR | 10-2013-0043368 | A | | 4/2013 |
| KR | 10-1468730 | B1 | | 12/2014 |

* cited by examiner

SUBSTRATE PROCESSING APPARATUS

TECHNICAL FIELD

The present invention relates to an apparatus for processing substrate, more particularly, to an apparatus for processing substrate capable of adjusting a separation distance formed between turns of an antenna.

BACKGROUND ART

As a plasma generation device, there are a capacitively coupled plasma source (CCP), an inductively coupled plasma source (ICP) and helicon using plasma wave, and microwave plasma source, etc. Among them, the inductively coupled plasma source is widely used, because a high-density plasma can be easily formed.

The ICP type plasma generator has an antenna installed above the chamber. The antenna creates a magnetic field in the interior space of the chamber by RF power applied from a power source, and an induced electric field is formed by the magnetic field. At this time, a reaction gas supplied into the chamber obtains sufficient energy required for ionization from an inductively generated electric field to form plasma, and the plasma moves to the substrate to process the substrate.

DISCLOSURE OF THE INVENTION

Technical Problem

An object of the present invention is to provide an apparatus for processing substrate capable of controlling the density distribution of plasma formed inside a chamber.

Another object of the present invention is to provide an apparatus for processing substrate capable of improving process uniformity for a substrate.

Further another object of the present invention will become evident with reference to following detailed descriptions and drawings.

Technical Solution

In accordance with an exemplary embodiment of the present invention, an apparatus for processing substrate comprising: a support plate; an antenna disposed in parallel to one surface of the support plate and having 1st to n-th turns (n=an integer greater than 3) wound along one direction from an inner end; and a distance control unit capable of adjusting separation distances formed between the 1st to n-th turns.

An outer end of the antenna may be fixed, and the distance control unit may include: a holder connected to the inner end of the antenna; and a driving motor connected to the holder to rotate the antenna in the one direction or in a direction opposite to the one direction.

The distance control unit may further include a plurality of supporters fixed between the (m−1)-th turn and the m-th turn to limit the movement of the m-th turn (m=an integer that is 2,3, . . . , n−1).

The support plate may have a plurality of fixing grooves arranged to be spaced apart from the center, and the supporters may be respectively inserted and fixed to the fixing grooves.

The substrate processing apparatus may further include: a chamber having an inner space in which a process is performed on a substrate, and an upper portion thereof being opened; and a susceptor installed in the chamber on which the substrate is placed, and the support plate may be installed above the chamber.

Advantageous Effects

According to an embodiment of the present invention, a density distribution of plasma formed inside the chamber may be controlled by adjusting the arrangement of the antenna. In addition, by adjusting the arrangement of the antenna, the shape of the electric field can be controlled, thereby improving process uniformity for the substrate.

BEST MODE

Hereinafter, preferred embodiments of the present invention will be described in more detail with reference to FIGS. 1 to 4. The present invention may be embodied in different forms and should not be constructed as limited to the embodiments set forth herein. Rather, the embodiments are provided to explain the present invention more completely to those skilled in the art to which the present invention pertains. Therefore, the dimensions of each component shown in the figures are exaggerated for clarity of description.

Figure 1:
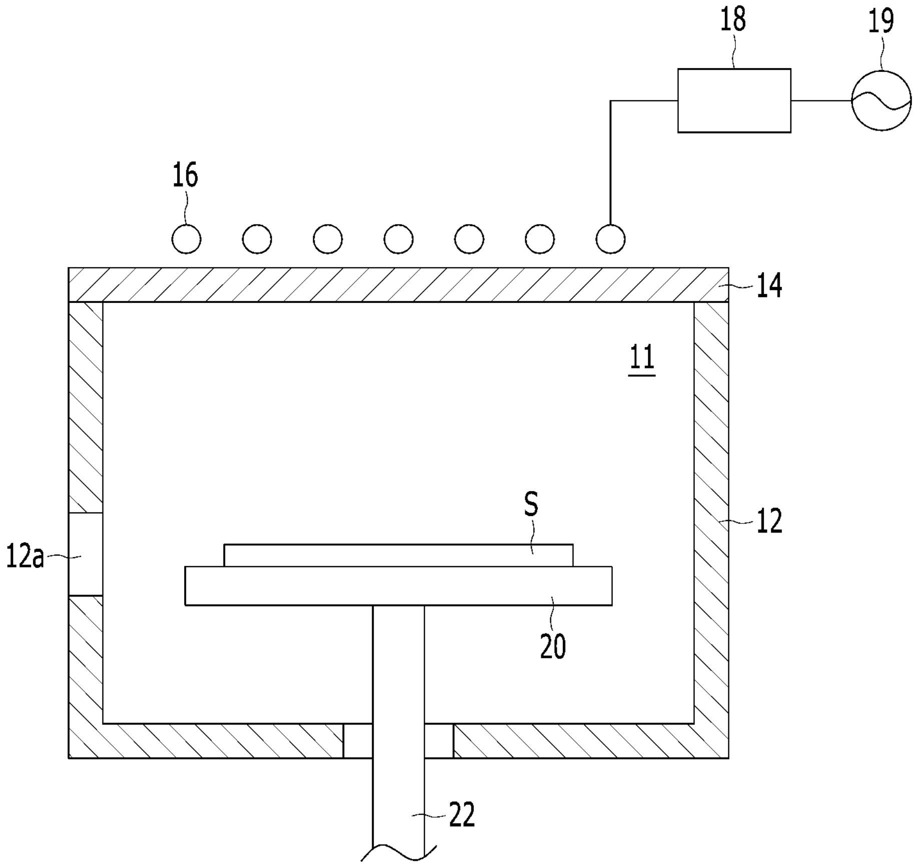
FIG. 1 shows an apparatus for processing substrate according to an exemplary embodiment of the present invention.

FIG. 1 shows an apparatus for processing substrate according to an exemplary embodiment of the present invention. As shown in FIG. 1, the chamber 12 has an inner space 11, and the upper part of the chamber 12 is in an open state. The support plate 14 is installed on the opened upper part of the chamber 12 and separates the inner space 11 from the outside.

The chamber 12 has a passage 12*a* formed on a side thereof, and the substrate S may be loaded into the inner space 11 or unloaded from the inner space 11 through the passage 12*a*. The susceptor 20 is installed in a lower part of the inner space and supported through a vertically arranged support shaft 22. The substrate S is loaded through the passage 12*a* and then placed in a substantially horizontal state on the upper surface of the susceptor 20.

The antenna 16 is a coil-type antenna disposed substantially parallel to the upper surface of the support plate 14, and as will be described later, has 1st to n-th turns (n=an integer greater than 3) wound in a counterclockwise direction from the inner end 16*a*. The antenna 16 is connected to a RF power supply 19, and the RF power supplies power to the antenna 16. A matcher 18 is installed between the antenna 16 and the RF power supply 19, and impedance matching between the antenna 16 and the RF power supply 19 can be achieved through the matcher 18.

The reaction gas is supplied to the inner space 11 through a showerhead (not shown) or an injection nozzle (not shown) installed in the inner space 11, and a plasma is generated through an electric field described later.

The antenna 16 creates a magnetic field in the internal space 11 through the power supplied from the RF power supply 19, and an induced electric field is formed by the magnetic field. To this end, the support plate 14 may be a dielectric window. At this time, the reactive gas obtains sufficient energy required for ionization from the inductively generated electric field to form plasma, and the plasma moves to the substrate to process the substrate.

Figure 2:
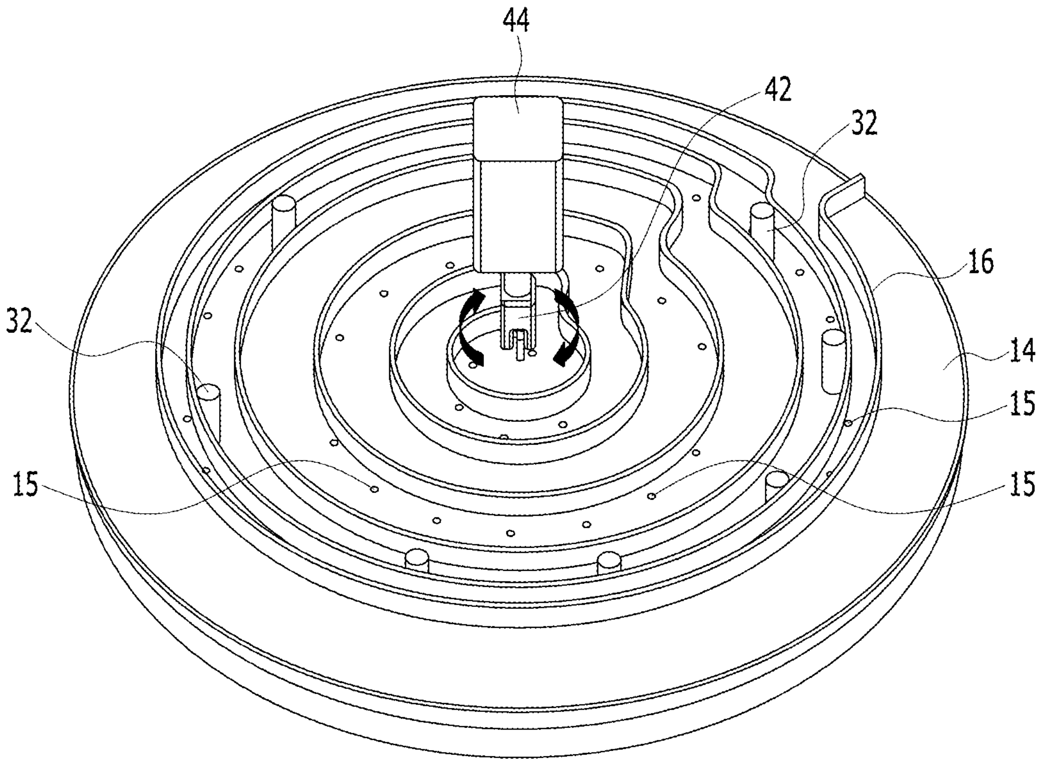
FIG. 2 shows an antenna and a distance control unit fixed to the support plate shown in FIG. 1.
Figure 3:
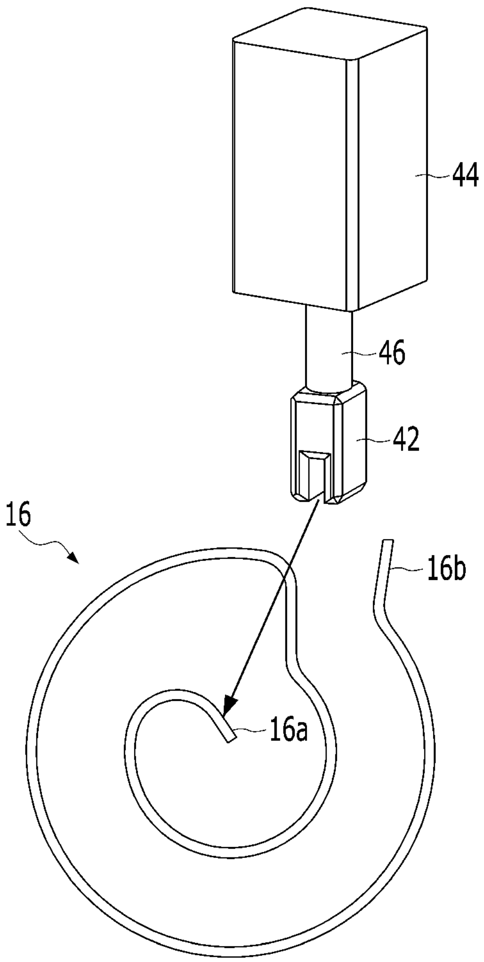
FIG. 3 shows the distance control unit shown in FIG. 2.

FIG. 2 shows an antenna and a distance control unit fixed to the support plate shown in FIG. 1, FIG. 3 shows the distance control unit shown in FIG. 2. As shown in FIGS. 2 and 3, the antenna 16 is disposed on the support plate 14, and is a coil-type antenna disposed substantially parallel to the upper surface of the support plate 14. The antenna 16 has 1st to nth turns (n=an integer greater than 3) spaced apart from each other while being wound in a counterclockwise direction from the inner end 16*a*.

Meanwhile, as described above, the antenna 16 generates an electric field in the inner space 11 to generate plasma from the reaction gas supplied to the inner space 11, thereby processing the substrate. In this case, the density distribution of the generated plasma depends on the shape of the electric field induced by the antenna 16 and the shape of the electric field generated by the antenna 16 depends on the shape of the antenna 16. Accordingly, when the process uniformity is poor in the result of the substrate processing process through plasma, the shape of the antenna 16 can be adjusted to improve the process uniformity.

For example, as a result of the deposition process, when the thickness of the thin film deposited on the entire surface of the substrate is significantly non-uniform, that is, the thickness of the thin film is high in the center region of the substrate and the thickness of the thin film is low in the edge region. Such process non-uniformity may have various reasons, but one reason may be the non-uniformity of plasma, that is, high plasma density in the center region of the substrate and low plasma density in the edge region of the substrate. Plasma non-uniformity can be improved by adjusting the shape of the antenna 16. In addition, the appropriate plasma density distribution may vary depending on the process, and the method described below may be applied in various ways other than the necessity for improving the non-uniformity of the plasma.

The density distribution of the plasma in the inner space 11 depends on the distribution of the electric field induced by the antenna 16 or the distribution of the magnetic field, and the distribution of the electric field/magnetic field depend on the shape of the antenna 16. That is, as described above, as the separation distance formed between turns of the antenna 16 is decreases, the electric field/magnetic field become stronger and the density of plasma increases. Conversely, as the separation distance formed between turns of the antenna 16 increases, the electric field/magnetic field become weaker and the plasma density decreases.

Specifically, when the separation distance between turns in the central region of the antenna 16 decreases, the electric/magnetic field in the central region of the internal space 11 become stronger and the plasma density increases, thereby increasing the process rate (or the thickness of the thin film). On the contrary, when the distance between turns in the central region of the antenna 16 increases, the electric/magnetic field in the central region of the inner space 11 become weaker and the plasma density decreases, thereby reducing the process rate. The same is true for the edge region of the antenna 16.

The separation distance between turns can be adjusted by winding or unwinding the inner end 16*a* of the antenna 16, and winding or unwinding the inner end 16*a* is achieved by rotating the inner end 16*a* of the antenna 16 through the holder 42.

Specifically, as shown in FIGS. 1 and 2, in a state in which the antenna 16 is placed above the support plate 14, the outer end 16*b* of the antenna 16 is fixed to the upper surface of the support plate 14. The inner end 16*a* of the antenna 16 is inserted into the insertion groove of the holder 42, and the inner end 16*a* is disposed in the center region of the support plate 14.

The holder 42 has an insertion groove recessed from the bottom, and is connected to the drive motor 44 through a rotation shaft 46. The holder 42 is rotatable in the forward or reverse direction by the drive motor 44, and can rotate together with the inner end 16*a*.

Figure 4:
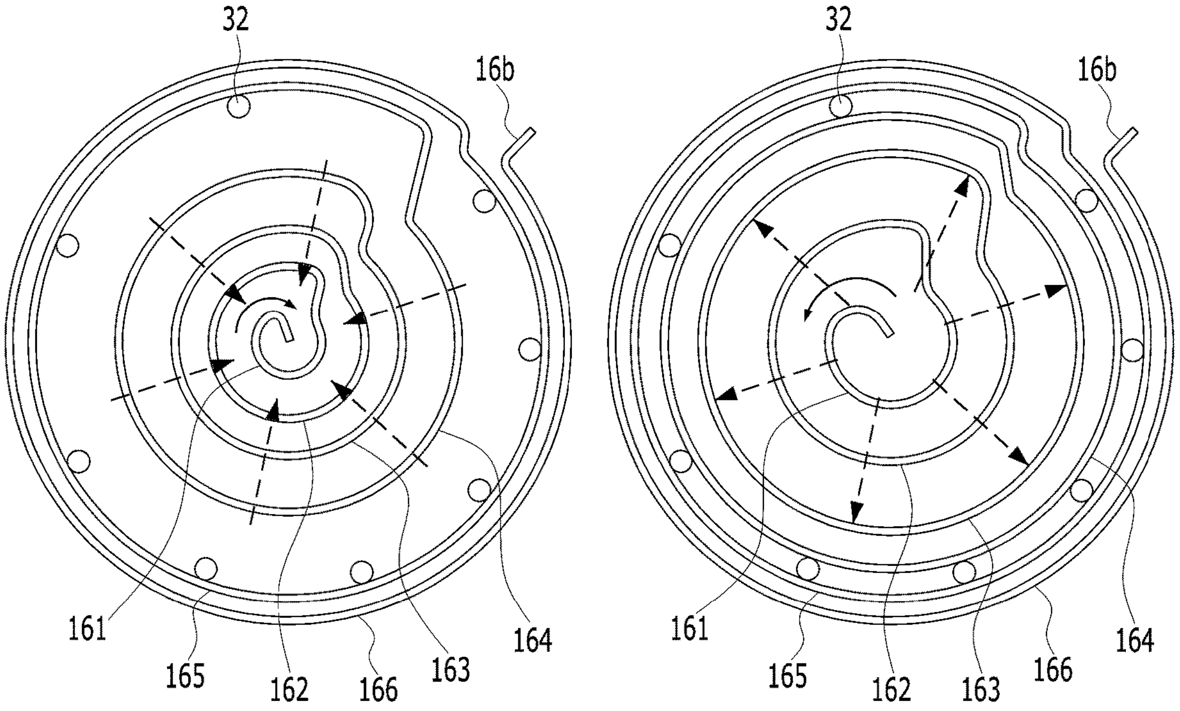
FIG. 4 shows an adjusted state of the antenna shown in FIG. 2.

FIG. 4 shows an adjusted state of the antenna shown in FIG. 2. As shown in FIG. 4, when the holder 42 rotates clockwise, the inner end 16*a* rotates in a direction opposite to the direction in which the turn of the antenna 16 is wound, so that the antenna 16 is wound more tightly and the separation distance between turns placed in the center area is reduced. Accordingly, in the central region of the inner space 11, the electric/magnetic field becomes stronger and the plasma density increases, so that the process rate (or the thickness of the thin film) increases.

On the contrary, as shown in FIG. 4, when the holder 42 rotates in a counterclockwise direction, the inner end 16*a* rotates in the direction in which the turn of the antenna 16 is wound, so that the antenna 16 is released and the separation distance between turns placed in the center area is increased. Accordingly, in the central region of the inner space 11, the electric/magnetic field is weakened and the plasma density decreases, so that the process rate (or the thickness of the thin film) decreases.

In this way, the antenna 16 can be deformed, and the distribution of the electric/magnetic field and the density distribution of the plasma in the center region and the edge region of the inner space 11 can be adjusted, respectively.

On the other hand, the supporter 32 is fixed to the support plate 14 and disposed between turns of the antenna 16, and can support the turn of the antenna 16 and limit the movement when the inner end 16*a* is rotated, have. The support plate 14 has a plurality of fixing grooves 15 formed on the upper surface, and the fixing grooves 15 are disposed to be spaced apart from the center of the support plate 14. The lower ends of the supporters 32 are respectively inserted into the fixing grooves 15 to support the turn of the antenna 16 in a state in which a displacement by an external force is restricted.

As described above, when the inner end 16*a* is rotated to adjust the separation distance between turns, the supporters 32 serve as a boundary that separates the adjusted area in which the separation distance is adjusted and the non-adjusted area in which the separation distance is adjusted. That is, as shown in FIG. 4, when the separation distance of the turns of the antenna 16 located inside the supporters 32 decreases, the turns of the antenna 16 located outside the supporters 32 are limited in movement by the supporters 32, so that the separation distance is maintained substantially the same. Conversely, when the separation distance between turns of the antenna 16 located inside the supporters 32 increases, the turns of the antenna 16 adjacent to the supporters 32 and the turns of the antenna 16 located outside the supporters 32 are limited in movement by the supporters 32, so that the separation distance is maintained substantially the same.

Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various apparatus for manufacturing semiconductor or a various method for manufacturing semiconductor.

What is claimed is:

1. An apparatus for processing substrate comprising:

a support plate;

an antenna disposed in parallel to one surface of the support plate, the antenna having 1st to n-th turns (n=an integer greater than 4) spaced apart from each other and wound along one direction from an inner end;

a plurality of supporters fixed between the (m−1)-th turn and the m-th turn of the antenna to limit movement of the (m−1)-th turn and the m-th turn (m=an integer greater than 3 and less than n); and a distance control unit capable of adjusting separation distances formed between the 1st to the (m−1)-th turns by rotating the inner end of the antenna in the one direction or in a direction opposite to the one direction, the distance control unit including a holder connected to the inner end of the antenna and a driving motor connected to the holder to rotate the antenna, wherein the antenna includes:

an inner part having the 1st to the (m−1)-th turns and being located inside the supporters, the separation distances formed between the 1st to the (m−1)-th turns being adjustable when the antenna is rotated; and an outer part having the m-th to the n-th turns and being located outside the supporters, the separation distances formed between the m-th to the n-th turns being maintained substantially the same when the antenna is rotated, and wherein outward movement of the (m−1)-th turn and inward movement of the m-th turn are limited by the supporters.

2. The apparatus of claim 1, wherein an outer end of the antenna is fixed.

3. The apparatus of claim 1, wherein the support plate has a plurality of fixing grooves arranged to be spaced apart from a center, and the supporters are respectively inserted and fixed to the fixing grooves.

4. The apparatus according to claim 1, the apparatus further comprising:

a chamber having an inner space in which a process is performed on a substrate, and an upper portion thereof being opened; and a susceptor installed in the chamber on which the substrate is placed, wherein the support plate is installed above the chamber.

5. The apparatus according to claim 2, the apparatus further comprising:

a chamber having an inner space in which a process is performed on a substrate, and an upper portion thereof being opened; and a susceptor installed in the chamber on which the substrate is placed, wherein the support plate is installed above the chamber.

6. The apparatus according to claim 3, the apparatus further comprising:

a chamber having an inner space in which a process is performed on a substrate, and an upper portion thereof being opened; and a susceptor installed in the chamber on which the substrate is placed, wherein the support plate is installed above the chamber.

* * * * *